United States Patent [19]
van Laarhoven et al.

[11] Patent Number: 4,948,459
[45] Date of Patent: Aug. 14, 1990

[54] METHOD OF ENABLING ELECTRICAL CONNECTION TO A SUBSTRUCTURE FORMING PART OF AN ELECTRONIC DEVICE

[75] Inventors: Josephus M. F. G. van Laarhoven; Leendert de Bruin; Anton P. M. van Arendonk, all of Eindhoven, Netherlands

[73] Assignee: U.S. Philips Corporation, New York, N.Y.

[21] Appl. No.: 293,274

[22] Filed: Jan. 4, 1989

[30] Foreign Application Priority Data

Jan. 20, 1988 [GB] United Kingdom ............... 8801172

[51] Int. Cl.[5] .................. B44C 1/22; C03C 15/00; C03C 25/06; C23F 1/02
[52] U.S. Cl. ................. 156/643; 156/646; 156/653; 156/656; 156/657; 156/659.1; 156/668; 204/192.37; 357/71; 437/192; 437/194
[58] Field of Search ............. 156/643, 646, 653, 656, 156/657, 659.1, 651, 652, 668; 437/189, 192, 194, 200; 204/192.32, 192.35, 192.36, 192.37; 357/71

[56] References Cited

U.S. PATENT DOCUMENTS

| | | | |
|---|---|---|---|
| 4,172,004 | 10/1979 | Alcorn et al. | 437/190 X |
| 4,396,458 | 8/1983 | Platter et al. | 156/656 X |
| 4,614,021 | 9/1986 | Hulseweh | 437/189 |
| 4,670,091 | 6/1987 | Thomas et al. | 156/656 X |
| 4,670,967 | 6/1987 | Hazuki | 437/194 X |
| 4,824,521 | 4/1989 | Kulkarni et al. | 156/656 |

FOREIGN PATENT DOCUMENTS

0082012 2/1983 .

OTHER PUBLICATIONS

Sirkin et al., "A Method of Forming Contacts Between Two Conducting Layers Separated by a Dielectric", Journal of Electrochemical Society: Solid-State Science and Technology, vol. 131, No. 1, Jan. 1984, pp. 123-125.

Primary Examiner—William A. Powell
Attorney, Agent, or Firm—Paul R. Miller

[57] ABSTRACT

A method of enabling electrical connection to a substructure (10) forming part of an electronic device, such as an integrated circuit, is described in which an aluminum-containing electrically conductive level (1) is provided on a surface (12) of the substructure (10), an insulating layer (2) is deposited so as to cover the aluminum-containing electrically conductive level (1), a photosensitive resist layer (3) is provided on the insulating layer and a plasma etching step is then used to etch away insulating material so as to expose an electrically conductive surface to enable electrical connection to be made to the level (1). The insulating material (2) may be etched through a window in the resist layer (3) so as to form a via (14) or the resist layer (3) and insulating material (2) may be etched uniformly to provide a planarized surface. In the method, a layer (4) of another conductive material which is free of aluminum is provided on the level (1) prior to covering the level (1) with insulating material (2) so that the plasma etching step exposes an electrically conductive surface (4a) of the layer (4) of the said other conductive material which thus acts to mask the level (1) to prevent catalytic reaction between the aluminum and constituents in the plasma.

9 Claims, 4 Drawing Sheets

METHOD OF ENABLING ELECTRICAL CONNECTION TO A SUBSTRUCTURE FORMING PART OF AN ELECTRONIC DEVICE

This invention relates to a method of enabling electrical connection to a substructure forming part of an electronic device which method comprises the steps of providing an aluminum-containing electrically conductive level on a surface of the substructure, depositing an insulating layer so as to cover the aluminum-containing electrical conductive level, providing a photosensitive resist layer on the insulating layer, and etching insulating material away using a plasma etching technique so as to expose an electrically conductive surface to enable electrical connection to be made to the aluminum-containing electrically conductive level.

Such a method may be used in, for example, the fabrication of semiconductor integrated circuits where two or more levels of metallisation are required, for example in the manufacture of random access memory integrated circuits.

The present Inventors have however found that when such a method is used in practice, a large amount of carbonaceous polymer is produced by reaction between constituents in the plasma. The carbonaceous polymer adheres to surfaces in the plasma etching system, especially the substructure being processed. Such polymer material although nominally insulating does not have well defined properties nor are its properties reproducible from one sample to another. Thus, this polymer material is not useable as a good insulating material. Moreover any such polymer which adheres to exposed electrically conducting surfaces could detrimentally affect the electrical connection with subsequent metallisation. It is therefore necessary that the polymer be removed before further processing. This however has proved to be extremely difficult and the Inventors have therefore sought a method of reducing the amount formation and/or facilitating its removal.

According to one aspect of the present invention, there is provided a method of enabling electrical connection to a substructure forming part of an electronic device, which method comprises the steps of providing an aluminum-containing electrically conductive level on a surface of the substructure, depositing an insulating layer so as to cover the aluminum-containing electrically conductive level, providing a photosensitive resist layer on the insulating layer, and using a plasma etching step to etch away insulating material so as to expose an electrically conductive surface to enable electrical connection to be made to the aluminum-containing electrically conductive level, which method is characterised in that a layer of another conductive material which is free of aluminum is provided on the aluminum-containing electrically conductive level prior to covering the aluminum-containing electrically conductive level with insulating material so that the plasma etching step exposes an electrically conductive surface of the layer of the said other conductive material which masks the aluminum-containing electrically conductive level to prevent catalytic reaction between the aluminum and constituents in the plasma.

The Inventors have found that the aluminum of an aluminum surface exposed by a plasma etching step acts as a catalyst for polymer formation and that masking the aluminum-containing electrically conductive level with a layer of another electrically conductive material prior to the deposition of the insulating material causes the amount of polymer formed to be at least considerably reduced, no polymer being visible after the plasma etching step in experiments carried out by the Inventors.

A method in accordance with the invention may be used where, for example, it is desired to etch back the insulating material so as to provide a relatively flat surface at which an electrically conductive surface area is exposed. In such circumstances, the photosensitive resist is applied as a sacrificial planarising layer. Thus, in this example, the photosensitive resist is spun on to provide a more flat free surface and then the plasma etching step is carried out so that the photosensitive resist and underlying insulating material are etched at about the same rates until the electrically conductive surface area of the layer of the other material is exposed.

A method in accordance with the invention may also be used where it is desired to form a via or through hole through the insulating material. In such a case, the photosensitive resist is applied to the insulating material, possibly after planarisation of the insulating material by use of a non-sacrificial planarising layer of a material such as spin-on glass. The applied photosensitive resist is then patterned using conventional photolithographic and etching techniques to define a mask through which the insulating material is etched by the plasma etching step to form a via exposing part of the electrically conductive surface area of the said layer of the other electrically conductive material.

A method in accordance with the invention enables an electrically conductive surface area to be exposed in a relatively simple and straightforward manner using a single plasma etching step. The plasma used may be a fluorine-containing plasma. The active constituents of the plasma may be altered or adjusted during the plasma etching step, or even the etching stopped and then restarted, so as to optimise the plasma etching.

Where a via is being formed, the constituents of the plasma may be altered during the plasma etching step so that, after a predetermined thickness of the insulating layer has been etched through the window in the photosensitive resist layer, one or more constituents are added to the plasma for a predetermined period to etch the photosensitive resist layer to form a larger window through which etching of the insulating layer continues after the predetermined period to form a stepped via.

A method in accordance with the invention may be particularly advantageous when used in the formation of a via because, in the absence of the masking electrically conductive layer used in a method in accordance with the invention, there may be considerable formation of polymer which is very difficult to remove and may even leave a ring or crown of polymer around the periphery of the via or a step in the via after removal of the photosensitive resist. Such a ring or crown of polymer causes considerable problems for the deposition of subsequent metallisation and may, for example, make filling of the via difficult and unreliable. Using a method in accordance with the invention, however, any polymer which is produced is removed with the photosensitive resist enabling such problems to be avoided or at least reduced.

The aluminum-containing electrically conductive level may be rx an aluminum level while the other material may be a material such as a material selected from the group consisting of titanium, tungsten, molybdenum, cobalt, chromium, hafnium, alloys of one or more of the aforementioned metals and silicides of the aforementioned metals.

Embodiments of the invention will now be described, by way of example, with reference to the accompanying drawings, in which.

Figure 1:
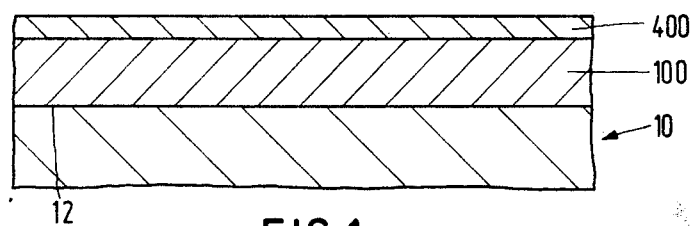
FIGS. 1, 2, 3, 4, 5 and 6 are schematic cross-sectional views of part of a substructure forming part of an electronic device and illustrate various sequential stages in one method embodying the invention.

It should be noted that the Figures are diagrammatic and not drawn to scale. The relative dimensions and proportions of parts of these Figures (particularly in the direction of thickness) have been shown exaggerated or diminished for the sake of clarity and convenience in the drawings. The same (or related) reference signs as used in one embodiment are generally used for referring to corresponding or similar parts in other embodiments.

Referring now to the drawings, FIGS. 1 to 9 illustrate methods in accordance with the invention of providing electrical connection to a substructure 10 forming part of an electronic device. The methods comprise the steps of providing an aluminum-containing electrically conductive level 1 on a surface 12 of the substructure 10, depositing an insulating layer 2 so as to cover the surface 12 and then providing a photosensitive resist layer 3 on the insulating layer 2 so that the aluminum-containing electrically conductive level 1 is covered by insulating material, and etching insulating material 2 away using a plasma etching technique so as to expose an electrically conductive surface 4a to enable electrical connection to be made to the aluminum-containing electrically conductive level 1. In accordance with the invention a layer of another conductive material 4 which is free of aluminum is provided on a surface 1a of the aluminum-containing electrically conductive level 1 prior to covering the aluminum-containing electrically conductive level 1 with insulating material 2 so that the plasma etching step exposes an electrically conductive surface 4a of the layer 4 of the other conductive material which masks the aluminum-containing electrically conductive level 1 to prevent catalytic reaction between the aluminum and constituents in the plasma.

Turning now to FIGS. 1 to 6, as shown in FIG. 1, a layer 100 of an aluminum-containing electrically conductive material is deposited using a conventional technique, for example a sputter deposition or chemical vapour deposition technique, onto a substructure 10 so as to connect electrically (although not shown) to an underlying part of the substructure 10 which part may be a lower metallisation level.

Another electrically conductive material 400 which is free of aluminum is then deposited onto the aluminum-containing layer 100, again using conventional techniques.

The aluminum-containing electrically conductive layer 100 may be an aluminum layer, or a layer of an aluminum alloy such as, for example, an aluminum-silicon-copper alloy or an aluminum-silicon-titanium alloy.

The other electrically conductive material 400 for masking the aluminum-containing layer 100 may be of any suitable material which can be deposited onto and which adheres satisfactorily to the aluminum-containing layer 100 so as to provide acceptable sheet and contact resistances at a temperature below that at which the aluminum-containing layer forms a eutectic with the other electrically conductive material, that is at a temperature below about 450 degrees Celsius where the layer 100 is an aluminum layer. Thus, for example, the overlying conductive material 400 may be a material selected from the group consisting of titanium, tungsten, molybdenum, cobalt, chromium, hafnium, alloys of one or more of the aforementioned metals and silicides of the aforementioned metals, for example an alloy such as titanium silicide. Also, materials such as titanium nitride may be used.

Where the electronic device is a VLSI integrated circuit involving possibly submicron dimensions, then the aluminum-containing layer 100 may be, for example, 500 to 1500 nanometers (nm) thick while the overlying electrically conductive material 400 may be, for example, about 30 nm thick, the thickness of the electrically conductive layer 400 being in any case sufficient so as to ensure that the plasma etching step does not expose the aluminum of the aluminum-containing layer 100.

After the electrically conductive material 400 has been deposited so as to cover the aluminum-containing layer 100, 400 the thus-formed composite electrically conductive layer is patterned using conventional photolithographic and etching techniques so as to define an aluminum conductive level 1 with a top surface 1a of the aluminum-containing conductive level 1 having a covering or capping layer 4 of the other electrically conductive material.

Figure 2:
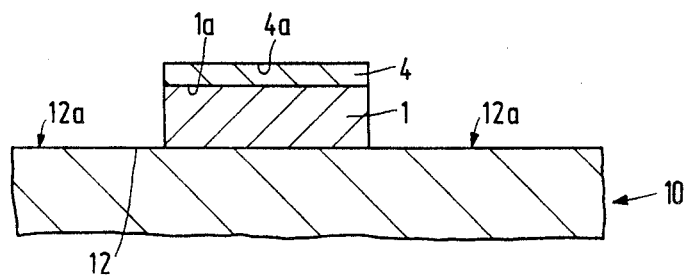

FIG. 2 shows part of the patterned composite conductive level. It should of course be appreciated that the aluminum-containing conductive level 1 may be formed of a number of aluminum-containing electrically conductive structures such as strips and/or regions each having a top surface 1a covered with a layer 4 of the other electrically conductive material, although only one such structure is shown in FIG. 2.

Although in the example described above with reference to FIGS. 1 and 2, the other electrically conductive material 400 is provided only on the top surface of the aluminum-containing layer 100, it may be possible to cover the aluminum-containing layer 100 with the other electrically conductive material 400 after the layer 100 has been patterned to provide the aluminum-containing conductive level 1. Thus, for example, where the other electrically conductive material is tungsten, the tungsten may be selectively deposited only on the aluminum-containing level 1. Alternatively, a first layer of the other electrically conductive material may be deposited onto the aluminum-containing conductive layer 100 prior to patterning and then a further layer of the other electrically conductive material blanket deposited onto the substructure after patterning, the further layer then being etched anisotropically back to expose the surface 12, thereby leaving a covering of the other conductive material on the side walls 1b of the aluminum-containing conductive level 1.

Figure 3:
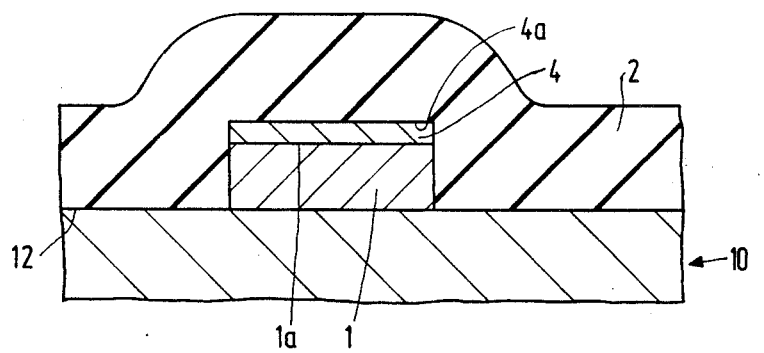

After the stage shown in FIG. 2 has been reached as described above, a layer 2 of insulating material, in this example a layer of silicon dioxide, is deposited, for example by plasma enhanced chemical vapour deposition so as to cover the exposed surface areas 12 of the substructure 10 and also the aluminum-containing conductive level 1 and capping layer 4, thereby forming the structure shown schematically in FIG. 3.

Figure 4:
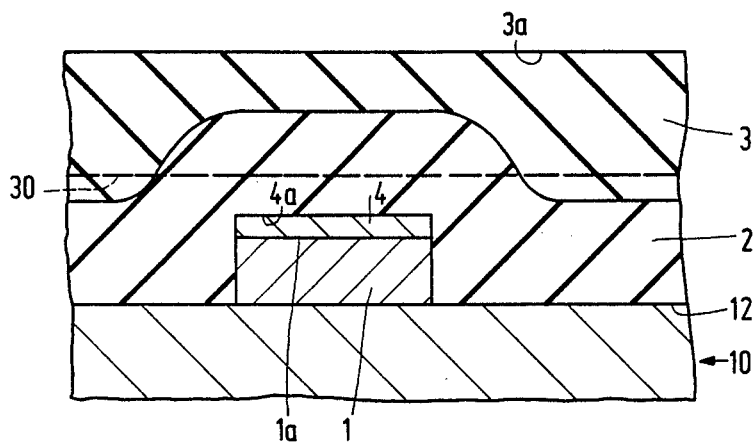

A layer 3 of a conventional photosensitive resist, for example a positive photosensitive resist such as HPR204 produced by the Hunt Company, is then applied to, usually spun onto, the surface of the insulating layer 2. The photosensitive resist 3 thus acts as a planarising medium, as will become evident below a sacrificial planarising medium, and provides a relatively flat or planarised free surface 3a as shown in FIG. 4.

Once the planarised free surface 3a has been formed, the insulating material is etched back using a plasma etching technique to expose the electrically conductive surface 4a of the capping layer 4. A fluorine-containing plasma, such as a carbon tetrafluoride ($CF_4$) plasma, a trifluoromethane ($CHF_3$) plasma, a sulphur hexafluoride ($SF_6$), or an $S_2F_6$ or a $NF_3$ fluoride-containing plasma, may be used.

The fluorine-containing plasma attacks the material of the photosensitive resist layer 3 and the silicon dioxide of the insulating layer 2 at approximately the same rate so that, as the etching proceeds, the etched surface of the insulating material remains relatively flat. The dashed line 30 in FIG. 4 illustrates the position of the free surface of the insulating material part way through the plasma etching step when both the photosensitive resist material and the silicon dioxide are being etched by the plasma.

The plasma etching step is caused to preceed until the electrically conductive surface 4a of the capping layer 4 is exposed. The end part of the etching step may be detected by monitoring the constituents within the plasma, for example by monitoring the spectrum of the plasma, and may be detected by conventional means, for example by selecting a point at which the amount of constituent material in the plasma derived from the photosensitive resist reaches a given level, as determined, as is conventional by the change in the carbon monoxide signal. Alternatively, it may be possible to watch for material etched from the capping layer 4 in the plasma.

The electrically conductive surface 4a is this exposed in a relatively simple and straightforward manner using a single plasma etching step. If required, depending on the constituents of the photoresist and the insulating layer, the active constituents of the plasma may be altered during the plasma etching step so as to provide optimum etching of the insulating material.

When the capping layer 4 is not present, the present Inventors have found that a large amount of carbonaceous polymer is produced by reaction between constituents in the plasma, that is between constituents present in the original plasma and/or constituents introduced into the plasma during the etching step. This carbonaceous polymer adheres to surfaces within the plasma etching system, especially to the sample being etched, and has proved to be extremely difficult to remove. Such polymer material, although nominally insulating, does not have well defined characteristics and its electrical, chemical and mechanical properties are not reproducible so that the polymer material does not provide a good insulator. Also any polymer formation on exposed electrically conductive surfaces could detrimentally affect electrical contact between the exposed electrically conductive surface and a subsequent electrically conductive layer.

The Inventors have found that, when the capping layer 4 is provided in accordance with the invention, the layer 4 prevents catalytic enhancement of polymer formation by aluminum in the aluminum-containing conductive layer and that undesired polymer formation is negligible, none being visible in the experiments carried out by the Inventors. Also any negligible amount of polymer which may be present is removed during subsequent processing steps without the need for any special treatment.

Figure 5:
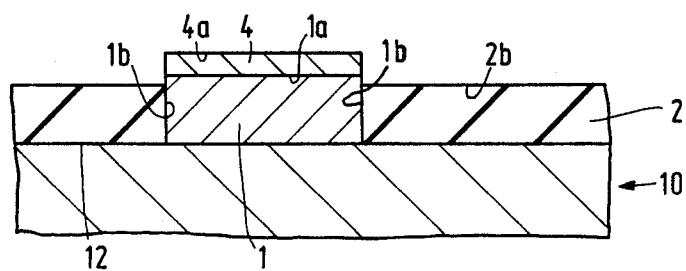
Figure 6:
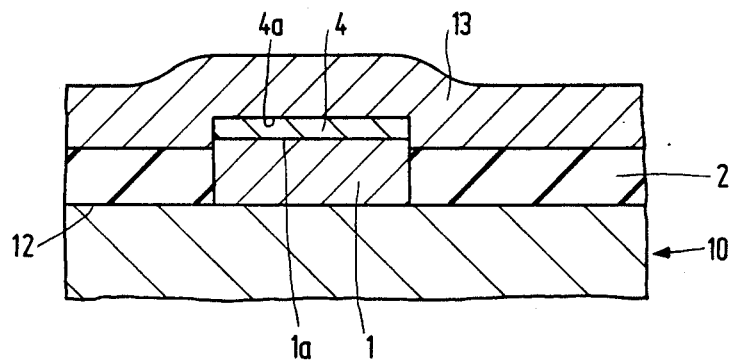

As indicated above, the aluminum-containing electrically conductive level 1 may consist of a number of conductive structures, for example strips, each of which is covered by part of the capping layer 4. In such circumstances, because, for example, of the topography of the underlying substructure 10, the thickness of the insulating layer 2 over the electrically conductive surface 4a may vary between conductive structures and it may be necessary for the insulating material over one conductive structure to be over-etched to enable the electrically conductive surface 4a of a conductive structure covered by a thicker region of insulating material to be exposed. Thus, for some conductive structures, as indicated in FIG. 5, the insulating material will normally be slightly over-etched so that the final insulating layer surface 2b is very slightly lower than the electrically conductive surface 4a. Depending on the thickness of the capping layer 4, this over-etching may expose a small area of side walls of the aluminum-containing conductive level 1. However, because of the anisotropic nature of the surface bombardment during the plasma etching step and the fact that the aluminum exposed forms part of a side wall 1b which is, or is nearly, parallel to the direction of bombardment, there should be no significant catalytic enhancement of polymer formation because of this exposure. Of course, if as mentioned above, the capping layer 4 can be deposited after patterning of the aluminum-containing conductive level, then the side walls as well as the top surface 1a of the aluminum-containing conductive level may be masked from the plasma thus ensuring that there is no exposure of the aluminum-containing conductive level 1 to the plasma even if the insulating material 2 is over-etched.

After any polymer has been removed from the surface, further metallisation 13, for example aluminum, maybe deposited, thus providing electrical connection to the aluminum-containing electrically conductive level 1 via the electrically conductive surface 4a of the electrically conductive capping layer 4 exposed during the plasma etching step. This further metallisation 13 may then be patterned as desired using conventional techniques to provide the required interconnections as is conventional for example in the art of semiconductor integrated circuit fabrication.

Figure 7:
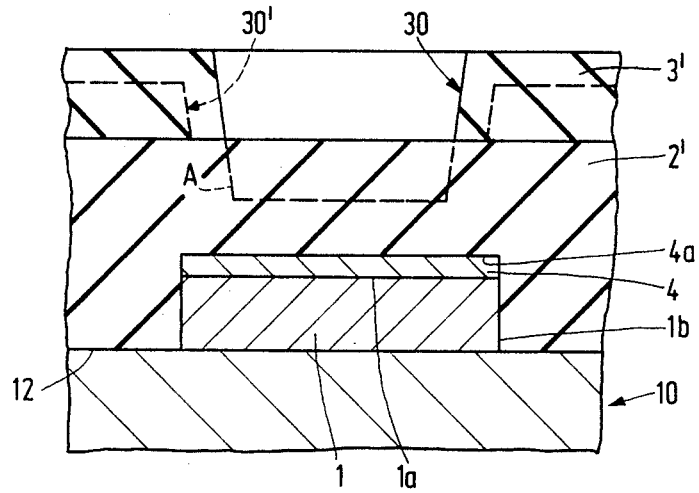
FIGS. 7, 8 and 9 are schematic cross-sectional views of part of a substructure forming part of an electronic device and illustrate stages in another method embodying the invention.
Figure 8:
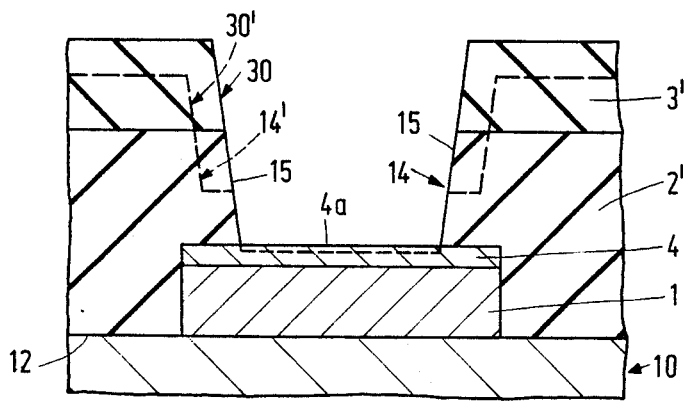
Figure 9:
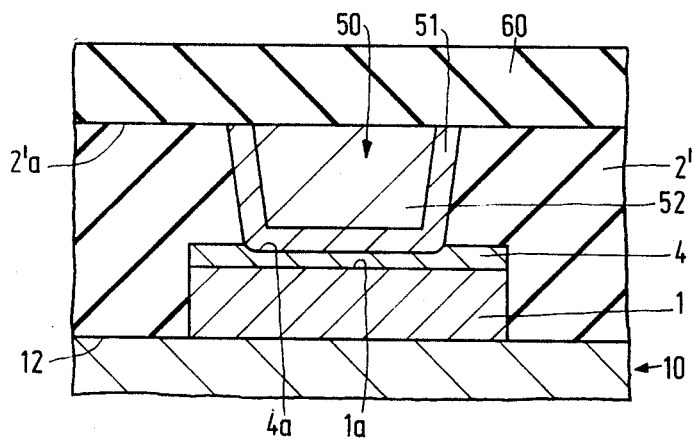

FIGS. 7, 8 and 9 illustrate steps in a method in accordance with the invention where a via is required through insulating material to expose an electrically conductive surface to enable electrical connection between the aluminum-containing electrically conductive level 1 and a subsequent level of metallisation to be provided on the insulating material.

The preliminary steps in this method are similar to those described above in relation to FIGS. 1 to 3. Thus, the aluminum-containing conductive layer 100 is deposited followed by the capping layer 400, both of which may be of any of the materials mentioned above with reference to FIGS. 1 to 6. The composite layer 100, 400 is then patterned as described above to provide the aluminum-containing conductive level 1 and capping layer 4 and insulating material, again silicon dioxide deposited as described above to provide an insulating layer covering the composite conductive level consisting of the aluminum-containing conductive level 1 and the capping layer 4.

In practice, because the insulating layer 2 follows the topography of the underlying conductive level 1, it is then usual to planarise the insulating layer surface so as to ensure good coverage for subsequent metallisation. This may be done by, for example, applying a non-sacrificial planarising medium, that is an insulating planarising medium having relatively good reproducible characteristics such as a spin-on-glass, for example Accuglas 204 or Accuglass 108 sold by Allied Chemical Co. of the United States of America, or by any other suitable planarising technique, for example that described above or a lift-off technique.

Once a relatively flat or planarised insulating layer 2' has been provided, a photoresist layer 3' is applied as described above. In this example however, the photoresist layer is patterned using conventional photolithographic techniques to define a mask having openings or windows through which the insulating layer may be etched. In the arrangement illustrated schematically in FIG. 7, a single mask opening 30 is illustrated. Of course, as will be appreciated, the number of openings or windows in the photoresist layer mask 3' will depend on the number of desired electrical connections to be made for the underlying aluminum-containing electrically conductive level 1.

After the window or opening 30 has been defined, the insulating material of the insulating layer 2' is etched using a plasma etching technique. As in the example given above, the plasma may be a fluorine-containing plasma such as one of the fluorine-containing plasmas mentioned above. The cured photoresist and defining the opening 30 serves to protect the underlying insulating material so that the plasma etching step produces, as shown in FIG. 8, a via or through hole 14 extending through the insulating layer 2' to expose the electrically conductive surface 4a. Again, for reasons similar to those mentioned above, it may be necessary for the insulating material to be over-etched for some vias. Also, the plasma etching step may be continued slightly longer than necessary so that a very thin surface layer of the capping layer 4 is removed so as to ensure that the electrically conductive surface 4a exposed by the plasma etching step is as free as possible of insulating material.

The active constituents of the plasma may be changed during the plasma etching step. Thus, it may be desirable, for example to enable better coverage by subsequent metallisation, to produce a via having stepped side walls. In such circumstances, after a predetermined thickness of insulating material has been etched away as indicated by the dashed line A in FIG. 7, one or more further active constituents, for example oxygen in the case of a $CF_3$ or $CHF_3$ plasma, is, or and added to the plasma so that as the etching step proceeds the photosensitive resist layer 3' is etched away or eroded. After a predetermined time, the supply of the further constituent(s), in this case oxygen, is stopped. This leaves a larger window 30' (shown in dashed lines in FIG. 7) so that as the etching step proceeds a via 14' having a stepped profile as indicated in dashed lines in FIG. 8 is formed. The number of times and duration of the supply of the further active constituents may be adjusted to produce a via having side walls with two, three or more steps.

Again, as in the example described above, the presence of the capping layer 4 masking the aluminum-containing electrically conductive level 1 serves to prevent catalytic enhancement of polymer formation within the plasma during the plasma etching step. Although a negligible amount of polymer may still be formed, especially by reaction between constituents in the plasma and the photosensitive resist (photoresist), such polymer can be easily removed as described above and is useful in that the deposition of a small amount of polymer on the side walls 15 of the via 14 being etched may serve to reduce or inhibit under-etching, that is to inhibit lateral etching of the insulating material which would cause the photoresist to overhang the via 14. In comparison where a via similar to the via 14 is formed in the absence of a capping layer 4 to mask the aluminum containing electrical conductive level 1, a large amount of polymer is formed which is so difficult to remove that, after removal of the photoresist mask layer 3', a ring or crown of polymer may be left standing proud around the periphery of the via 14 or around the periphery of a step in the side wall of a stepped via such as the via 14' shown in dashed lines in FIG. 8 thus causing considerable problems with the provision of subsequent metallisation.

After the photoresist layer 3' has been removed using conventional techniques and any residual polymer removed in the manner described above with reference to FIGS. 1 to 6, an electrically conductive plug is, for example, provided within the via 14 to provide an electrically conductive interconnection between the aluminum-containing electrically conductive level 1 (via the electrically conductive surface 4a exposed in the plasma etching step) and a subsequent level of metallisation. FIG. 9 illustrates one way of providing such an electrically conductive plug and subsequent metallisation.

In the example shown in FIG. 9, a conductive plug 50 may be formed by first depositing an adhesion layer 51 into the insulating layer 2' and into the via 14 to improve the adhesion to the insulating material of a subsequently-deposited tungsten layer. The adhesion layer 51 may be, for example, titanium or titanium-tungsten and may be sputter-deposited as is known in the art. After deposition of the tungsten, for example by chemical vapour deposition, the deposited material is etched back, for example using an $SF_6$ plasma etching step, to expose the surface 2'a of the insulating layer 2' leaving a plug 52 of tungsten within the via 14. A further level 60 of metallisation, in this example another aluminum-containing level, may then be formed by sputter-depositing and then patterning an aluminum layer.

Figure 10:
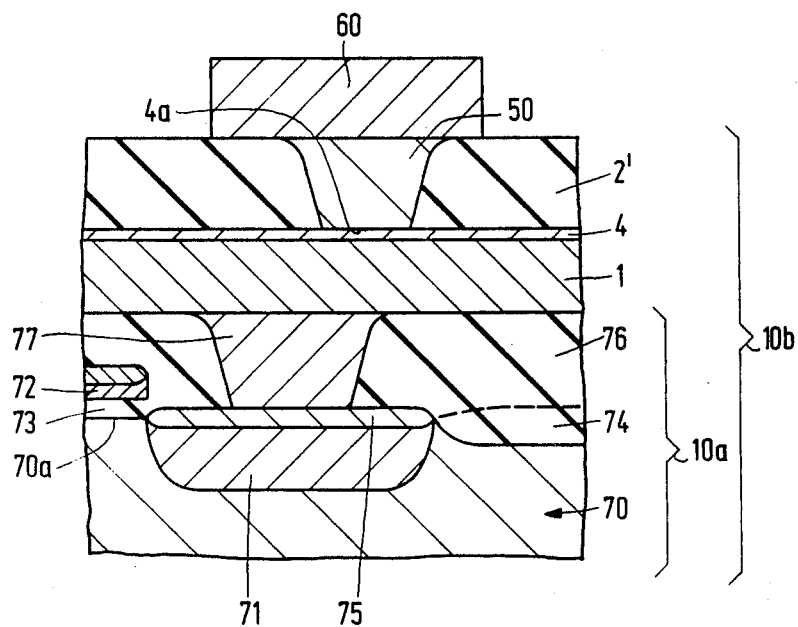
FIG. 10 is a schematic cross-sectional view of part of an electronic device forming part of an integrated circuit for which metallisation levels are provided using a method in accordance with the invention.

FIG. 10 is a schematic cross-sectional view illustrating part of a monocrystalline silicon semiconductor body 70 of an electronic device, for example an integrated circuit such as a CMOS integrated circuit having metallisation levels provided using a method in accordance with the invention.

The part of the semiconductor body 70 shown in FIG. 10 has a doped region 71 adjacent a surface 70a of the body 70. The semiconductor body 70 will of course incorporate many such doped regions. The particular region 71 shown in FIG. 10 forms a source or drain region of an insulated gate field effect transistor (MOST). An insulated gate for the MOST is provided on the surface 70a of the body 70 by a doped polycrystallisation silicon conductive gate 72 deposited onto a thin silicon dioxide gate layer 73. Field oxide 74 (indicated in part by a dashed line in FIG. 10) formed by local oxidation of silicon (LOCOS) in a known manner defines the area of the MOST.

In order to provide lower contact resistance to subsequent metallisation, titanium is sputter-deposited over the surface 70a and the body 70 is then heated rapidly to form a titanium silicide contact layer 75 at the exposed silicon surface areas, that is on the doped region 71 and on the polycrystalline silicon gate layer 72. The remaining titanium on the insulating material may be removed by etching in a solution of, for example, hydrogen peroxide and ammonium hydroxide in water.

An insulating layer 76 is then deposited by chemical vapour deposition onto the surface. Using conventional photolithographic and etching technique a via is opened through the insulating layer 76 and a conductive plug 77 provided in the via to enable connection to subsequent metallisation. The conductive plug 77 may be formed in the same manner as the conductive plug 50.

The above described elements indicated collectively by the reference numeral 10a in FIG. 10 form a substructure to which electrical connection is to be made using a method in accordance with the invention.

Thus the method described above with reference to FIGS. 1, 2, and 3 may be used to deposit and define an aluminum-containing conductive level 1 with a capping layer 4. Electrical connection to the aluminum-containing conductive level 1 may then be made by, as described with reference to FIGS. 7 and 8, plasma-etching a via through insulating material 2' protected by a photoresist mask layer and providing a conductive plug 50 in the via to enable a further conductive level 60 to make electrical connection to the aluminum-containing electrically conductive level 1 via the electrically conductive surface 4a. If a further metallisation level is required, the method described above with reference to FIGS. 1 to 6 may be adopted in which case the structure shown in FIG. 10 up to the top of the insulating layer 2' could be considered as a substructure 10b to which electrical connection is to be made in accordance with the invention.

If no further metallisation level is required and thus the flatness of the conductive level 60 is not so important, then it may be possible, dependent on the dimensions of the via, to omit the conductive plug 50 and rely on the deposition of the metal to form the conductive level 60 to provide connection through the via to the conductive level 1. In such circumstances, in order to provide good metallisation coverage, it may be advantageous for the via to be formed with stepped side walls as described above.

A method in accordance with the invention may of course be used to enable connection to conductive doped polycrystalline silicon gates as well as to doped semiconductor regions.

A method embodying the invention may be used to provide electrical connection to a substructure forming part of a semiconductor device which may, as described above, be an integrated circuit, semiconductor device or which may be a discrete semiconductor device, even a power semiconductor device. A method embodying the invention may also have applications in other electronic device fields, for example in the fields of liquid crystal displays and magnetic bubble memories.

From reading the present disclosure, other modifications will be apparent to persons skilled in the art. Such modifications may involve other features which are already known in the art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation or modification of one or more of those features, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

What is claimed is:

1. A method of enabling electrical connection to a substructure forming part of an electronic device, which method comprises the steps of providing an aluminum-containing electrically conductive level on a surface of the substructure, depositing an insulating layer so as to cover the aluminum-containing electrically conductive level, providing a photosensitive resist layer on the insulating layer and using a plasma etching step to etch away insulating material so as to expose an electrically conductive surface to enable electrical connection to be made to the aluminum-containing electrically conductive level, which method is characterized in that a layer of another conductive material which is free of aluminum is provided on the aluminum-containing electrically conductive level prior to covering the aluminum-containing electrically conductive level with insulating material so that the plasma etching step exposes an electrically conductive surface of the layer of the another conductive material which masks the aluminum-containing electrically conductive level to prevent catalytic reaction between the aluminum and constituents in the plasma, wherein the step of altering the constituents of the plasma during the plasma etching step is carried out.

2. A method according to claim 1, which comprises the step of defining an opening in the photosensitive resist layer prior to the plasma etching step and then using the plasma etching step to etch the insulative layer through the opening in the photosensitive resist layer so as to form a via through the insulating layer to expose the electrically conductive surface of the another conductive material which masks the aluminum-containing electrically conductive level to prevent catalytic reaction between aluminum and constituents in the plasma.

3. A method according to claim 1, which comprises, after applying a photosensitive resist layer to the insulating layer so as to provide a planar free surface, using the plasma etching step to etch the photosensitive resist layer and insulating layer uniformly so as to provide a planar surface and so as to expose the electrically conductive surface of the layer of the another conductive material which masks the aluminum-containing electrically conductive level to prevent catalytic reaction between aluminum and constituents in the plasma.

4. A method according to claim 2, wherein after a predetermined thickness of the insulating layer has been etched through the window in the photosensitive resist layer, one or more constituents are added to the plasma for a predetermined period to etch the photosensitive resist layer to form a larger window through which etching of the insulating layer continues after the predetermined period to form a stepped via.

5. A method according to claims 1, 2, 3, or 4, which comprises providing an aluminum level as the aluminum-containing electrically conductive level.

6. A method according to claims 1, 2, 3 or 4, which comprises using as the another conductive material a material selected from the group consisting of titanium, tungsten, molybdenum, cobalt, chromium, hafnium, alloys of one or more of the aforementioned metals and silicides of the aforementioned metals.

7. A method according to claims 1, 2, or 4, which comprises using a fluoride-containing plasma for the plasma etching.

8. A method according to claims 1, 2, 3, or 4, which comprises providing the insulating layer as a silicon dioxide layer.

9. A method according to claims 1, 2, 3, or 4, which comprises, after the plasma etching step, depositing further conductive material to provide an electrical connection to the aluminum-containing electrically conductive level.

* * * * *